US006372676B1

(12) United States Patent
Kishida et al.

(10) Patent No.: US 6,372,676 B1
(45) Date of Patent: Apr. 16, 2002

(54) CERAMIC SUBSTRATE COMPOSITION AND CERAMIC CIRCUIT COMPONENT

(75) Inventors: Kazuo Kishida, Shiga-ken; Hirofumi Sunahara, Moriyama; Mitsuyoshi Nishide, Shiga-ken; Hiroshi Takagi, Otsu, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/317,500

(22) Filed: May 24, 1999

(30) Foreign Application Priority Data

May 25, 1998 (JP) ............................. 10-143115

(51) Int. Cl.⁷ .................... C03C 10/04; C03C 14/00
(52) U.S. Cl. .................. 501/5; 501/32; 501/9
(58) Field of Search .................. 501/9, 32, 5

(56) References Cited

U.S. PATENT DOCUMENTS

| 3,776,764 A | * 12/1973 | Takagi et al. ................. 501/15 |
| 4,605,632 A | 8/1986 | Elmer |
| 4,621,066 A | * 11/1986 | Nisigaka et al. ............... 501/8 |
| 4,642,148 A | 2/1987 | Kurihara et al. |
| 4,683,168 A | 7/1987 | Hares et al. |
| 4,788,046 A | * 11/1988 | Barringer et al. ............. 501/32 |
| 5,658,835 A | 8/1997 | Onitani et al. |
| 5,733,828 A | * 3/1998 | Usui et al. .................... 501/15 |
| 5,747,396 A | * 5/1998 | Miyakoshi et al. ........... 501/32 |
| 6,008,151 A | * 12/1999 | Sasaki et al. ................. 501/32 |

FOREIGN PATENT DOCUMENTS

| EP | 0464757 A1 | | 1/1992 |
| JP | 402030641 A | * | 2/1990 |
| JP | 406040761 A | * | 2/1994 |
| JP | 2000086288 | * | 3/2000 |

* cited by examiner

Primary Examiner—Karl Group
(74) Attorney, Agent, or Firm—Ostrolenk, Faber, Gerb & Soffen, LLP

(57) ABSTRACT

A ceramic substrate composition includes about 26 to 48% by weight of a $CaO$—$Al_2O_3$—$B_2O_3$—$SiO_2$ type glass, about 35 to 68% by weight of at least one of alumina, mullite, cordierite and forsterite, and about 3 to 24% by weight of quartz, said glass being capable of being crystallized to wollastonite by firing of the composition at a temperature of about 800 to 1000° C. A ceramic circuit component contains a circuit formed on the ceramic substrate obtained by firing the composition.

9 Claims, 1 Drawing Sheet

CERAMIC SUBSTRATE COMPOSITION AND CERAMIC CIRCUIT COMPONENT

BACKGROUND OF THE INVENTION

1. Field of the Invention

The present invention relates to a ceramic substrate composition which can be fired at a temperature of up to 1000° C. and a ceramic circuit component produced by use of the same such as a multilayer integrated circuit, a thick-film hybrid circuit, or the like.

2. Description of the Related Art

The conventional, main stream ceramic substrates for use in ceramic circuit components have been alumina substrates. However, the alumina substrates are required to be fired at a high temperature, namely, at about 1600° C. To obtain a multilayer substrate, there is a need to use a metal having a high melting point such as W, Mo, or the like as an internal conductor. However, since these metals with a high melting point have a relatively high electric resistance, the alumina substrates are unsuitable for use as the multilayer substrates in electronic components which are required to be used at high frequencies and speeds. Accordingly, greater attention, has been given to development of ceramic substrates having a low dielectric constant and capable of fired at a low temperature, that is, which have a firing temperature of up to 1000° C. so that the ceramic substrates can be fired together with metals such as Au, Ag, Ag—Pd, Ag—Pt, Cu, and the like.

With the conventional ceramic substrates capable of being fired at a low temperature, it has been much difficult to satisfy the requirements for a low dielectric constant, low loss, and high strength at the same time. Further, there is the problem that when an Ag type electrode is fired together with the substrates capable of being fired at a low temperature, Ag is diffused into the substrates during the firing.

SUMMARY OF THE INVENTION

Accordingly, it is an object of the present invention to provide a ceramic substrate composition which satisfies requirements for a low dielectric constant, low loss, and high strength, and which can be fired together with an Ag type electrode while the Ag is prevented from being diffused into the ceramic substrate, and to provide a ceramic circuit component produced by use of the ceramic substrate composition.

According to the present invention, there is provided a ceramic substrate composition which contains about 26 to 48% by weight of a CaO—$Al_2O_3$—$B_2O_3$—$SiO_2$ type glass, about 35 to 68% by weight of at least one kind of ceramic selected from the group consisting of alumina, mullite, cordierite and forsterite, and about 3 to 24% by weight of quartz, said glass being capable of being partially crystallized to wollastonite by firing the composition at a temperature of about 800 to 1000° C.

Preferably, the ceramic substrate composition contains up to about 5% by weight of at least one kind of alkali metal oxide selected from the group consisting of $Li_2O$, $K_2O$ and $Na_2O$.

Also preferably, the ceramic substrate composition contains up to about 5% by weight of at least one kind of metal oxide selected from the group consisting of $TiO_2$, $ZrO_2$, $CrO_2$ and CuO.

Further, according to the present invention, there is provided a ceramic circuit component which contains a conductor circuit formed on a ceramic substrate produced by molding and firing the above ceramic substrate composition.

The conductor circuit may contain at least one member selected from the group consisting of Ag, Au and Cu as a major component.

DESCRIPTION OF THE PREFERRED EMBODIMENT

Figure 1:
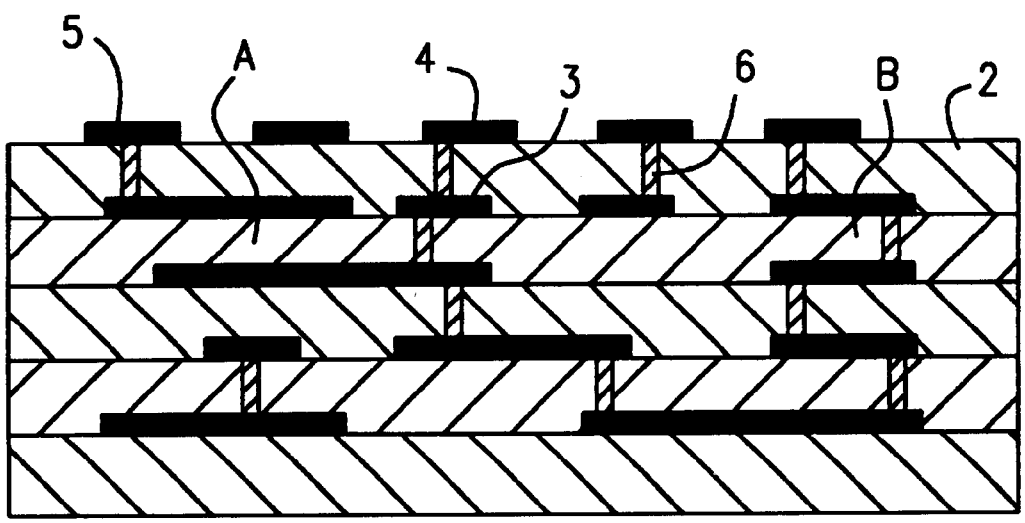
FIG. 1 is a cross-sectional view showing an example of the ceramic multilayer substrate according to the present invention.

The ceramic substrate composition of the present invention contains a CaO—$Al_2O_3$—$B_2O_3$—$SiO_2$ type glass, at least one kind of ceramic selected from the group consisting of alumina, mullite, cordierite and forsterite, and quartz in particular amounts.

The glass, by firing at about 800 to 1000° C., is partially crystallized to wollastonite. The glass when fired becomes softened and viscous, and flows so that it acts as a sintering agent useful in sintering the ceramic substrate composition at a temperature of up about to 1000° C., and moreover, is crystallized during and after the sintering, whereby the reduction of the loss of the ceramic substrate and the enhancement of its strength are promoted. In addition, the viscosity of the glass is increased with the crystallization. This prevents Ag from diffusing into the ceramic substrate. The diffusion has been a problem caused when the ceramic substrate is fired together with the Ag type electrode.

The content of the glass in the ceramic substrate composition of the present invention is preferably about 26 to 48% by weight. In the content range of less than about 26% by weight, the low temperature sintering, which is carried out at a temperature of up to about 1000° C., is impossible. In the content range exceeding about 48% by weight, the amount of the glass remaining uncrystallized in the ceramic substrate is very high, so that high strength and low loss of the ceramic substrate can not be achieved.

In order to realize such a high strength as can not be attained only by the crystallization of the glass, it is indispensable that the content of the ceramic is at least about 35% by weight. For the purpose of achieving the low temperature sintering of the ceramic substrate and its low dielectric constant, it is necessary that the content is not more than about 68% by weight.

Preferably, the content of quartz is in the range of about 3 to 24% by weight. In the content range of less than about 3% by weight, the dielectric constant of the ceramic substrate is excessively high. If the content exceeds about 24% by weight, a sufficiently high strength can not be rendered to the ceramic substrate.

The melting temperature of the glass can be reduced by adding at least one kind of alkali metal oxide selected from the group consisting of $Li_2O$, $K_2O$ and $Na_2O$ to the glass. The content is preferably up to about 5% by weight. If the content exceeds about 5% by weight, the dielectric constant of the ceramic substrate is enhanced, and simultaneously, the loss is increased.

In addition, by adding at least one kind of oxide selected from the group consisting of $TiO_2$, $ZrO_2$, $CrO_2$ and CuO in the glass, crystallization of the glass can be promoted. Preferably, the content is up to about 5% by weight. If the content exceeds about 5% by weight, the dielectric constant of the ceramic substrate is undesirably enhanced.

The ceramic circuit component of the present invention contains a conductor circuit or the like formed on the ceramic substrate obtained by molding and firing the above-described ceramic substrate composition. Since the ceramic substrate composition can be sintered at a temperature of up to about 1000° C., a conductor made of Ag, Au, Ag—Pd, Ag—Pt, Cu, or the like can be formed by sintering simultaneously with the ceramic.

EXAMPLE

As a starting material, alumina, mullite, cordierite, forsterite and quartz, each in the powdery state, were prepared. The glass powder was prepared as follows. To obtain the glass compositions shown in Table 1, CaO, $Al_2O_3$, $B_2O_3$, $SiO_2$, $Li_2O$, $K_2O$, $Na_2O$, $TiO_2$, $ZrO_2$, $CrO_2$, and CuO were weighed, respectively mixed and melted at a temperature of 1400 to 1700° C. The glass melting liquid material was quenched, and then, crushed by means of a ball mill to produce the glass powder.

Thereafter, the produced glass powder, alumina, mullite, cordierite and forsterite each in the powder state as a filler, and a quartz powder were mixed so as to obtain the composition ratios shown in Table. 1. Then, to the mixed raw material, predetermined amounts of a binder, a plasticizer and a solvent were added, and kneaded to form a slurry. The slurry was formed into a ceramic green sheet by doctor blade method.

Subsequently, a predetermined number of the ceramic green sheets were laminated, cut into a predetermined size, and then fired at the temperatures shown in Table 2. The sheets were polished to obtain porcelains of 36 mm long×4 mm wide×3 mm thick. The flexural strength (three point bending) of the obtained porcelains was measured in compliance with JIS Standard JIS R1601. Further, the crystal phase in the ceramic substrate was identified by X-ray diffraction analysis. The results are shown in Table 2.

In addition, using the obtained ceramic green sheets, a ceramic multilayer substrate circuit component was produced. More particularly, each ceramic green sheet was perforated by means of a punch. An Ag—Pd paste was filled into the perforation to form a via hole. Thereafter, the Ag—Pd paste was screen-printed to form conductive paste layer in a predetermined pattern. Then, a predetermined number of the ceramic green sheets were laminated and pressed, and fired in the air at the temperatures shown in Table 2, whereby the ceramic multilayer substrate 1 shown in FIG. 1 was obtained.

FIG. 1 is a cross sectional view of the obtained ceramic multilayer substrate 1. The substrate 1 contains a capacitor portion A and an inductor portion B. Further, the substrate 1 contains a ceramic layer 2, and a conductive layer 3 lying inside of the ceramic, conductive layers 4 and 5 on the surface of the ceramic, and a via hole 6.

A voltage with a frequency of 1 MHz was applied the conductor layers 4 and 5 of the ceramic multilayer substrate 1 produced as described above, and the capacitance and the Q factor of the capacitor A were measured. The dielectric constant ($\in$r) were calculated. The results are shown in Table 2.

TABLE 1

| Sample No. | Glass Composition (wt %) | | | | | Amount (wt %) | Filler Content (wt %) | | | | Total amount (wt %) | Quartz Amount (wt %) |
|---|---|---|---|---|---|---|---|---|---|---|---|---|
| | CaO | $Al_2O_3$ | $B_2O_3$ | $SiO_2$ | Other | | Alumina | Mullite | Cordierite | Forsterite | | |
| 1 | 40.0 | 5.0 | 10.0 | 45.0 | 0 | 30.0 | 60.0 | 0 | 0 | 0 | 60.0 | 10.0 |
| 2 | 40.0 | 5.0 | 10.0 | 45.0 | 0 | 45.0 | 40.0 | 0 | 0 | 0 | 40.0 | 15.0 |
| 3 | 40.0 | 5.0 | 10.0 | 45.0 | 0 | 40.0 | 55.0 | 0 | 0 | 0 | 55.0 | 5.0 |
| 4 | 40.0 | 5.0 | 10.0 | 45.0 | 0 | 42.5 | 50.0 | 0 | 0 | 0 | 50.0 | 7.5 |
| 5 | 40.0 | 5.0 | 10.0 | 45.0 | 0 | 35.0 | 45.0 | 0 | 0 | 0 | 45.0 | 20.0 |
| 6 | 40.0 | 5.0 | 10.0 | 45.0 | 0 | 45.0 | 40.0 | 10.0 | 0 | 0 | 50.0 | 5.0 |
| 7 | 40.0 | 5.0 | 10.0 | 45.0 | 0 | 40.0 | 45.0 | 0 | 10.0 | 0 | 55.0 | 5.0 |
| 8 | 40.0 | 5.0 | 10.0 | 45.0 | 0 | 42.5 | 40.0 | 0 | 0 | 10.0 | 50.0 | 7.5 |
| 9 | 40.0 | 5.0 | 10.0 | 45.0 | 0 | 45.0 | 20.0 | 30.0 | 0 | 0 | 50.0 | 5.0 |
| 10 | 40.0 | 5.0 | 10.0 | 45.0 | 0 | 40.0 | 25.0 | 0 | 0 | 30.0 | 55.0 | 5.0 |
| 11 | 42.3 | 2.3 | 10.1 | 45.3 | 0 | 45.0 | 50.0 | 0 | 0 | 0 | 50.0 | 5.0 |
| 12 | 46.7 | 2.8 | 5.5 | 45.0 | 0 | 48.0 | 48.0 | 0 | 0 | 0 | 48.0 | 4.0 |
| 13 | 40.5 | 1.6 | 12.3 | 45.6 | 0 | 46.0 | 50.0 | 0 | 0 | 0 | 50.0 | 4.0 |
| 14 | 41.0 | 1.6 | 10.3 | 46.1 | $Li_2O$ 1.0 | 42.5 | 50.0 | 0 | 0 | 0 | 50.0 | 7.5 |
| 15 | 40.1 | 1.7 | 10.0 | 45.0 | $K_2O$ 3.2 | 48.0 | 45.0 | 0 | 0 | 0 | 45.0 | 7.0 |
| 16 | 40.5 | 1.7 | 10.1 | 45.6 | $Na_2O$ 2.1 | 45.0 | 50.0 | 0 | 0 | 0 | 50.0 | 5.0 |
| 17 | 40.0 | 3.0 | 10.0 | 45.0 | $TiO_2$ 2.0 | 42.5 | 50.0 | 0 | 0 | 0 | 50.0 | 7.5 |
| 18 | 40.0 | 3.0 | 10.0 | 45.0 | $ZrO_2$ 2.0 | 42.5 | 50.0 | 0 | 0 | 0 | 50.0 | 7.5 |
| 19 | 40.0 | 3.0 | 10.0 | 45.0 | $CrO_2$ 2.0 | 42.5 | 50.0 | 0 | 0 | 0 | 50.0 | 7.5 |
| 20 | 40.0 | 3.0 | 10.0 | 45.0 | CuO 2.0 | 42.5 | 50.0 | 0 | 0 | 0 | 50.0 | 7.5 |
| *21 | 40.0 | 5.0 | 10.0 | 45.0 | 0 | 25.0 | 60.0 | 0 | 5.0 | 0 | 65.0 | 10.0 |
| *22 | 40.0 | 5.0 | 10.0 | 45.0 | 0 | 55.0 | 40.0 | 0 | 0 | 0 | 40.0 | 5.0 |
| *23 | 40.0 | 5.0 | 10.0 | 45.0 | 0 | 30.0 | 40.0 | 0 | 0 | 0 | 40.0 | 30.0 |
| *24 | 40.0 | 5.0 | 10.0 | 45.0 | 0 | 50.0 | 45.0 | 0 | 5 | 0 | 50.0 | 0 |

*indicates out of the scope of the invention.

TABLE 2

| Sample No. | Sintering temperature (° C.) | Crystal phase (**) | Flexural Strength (MPa) | Dielectric constant εr at 1 MHz | Q at 1 MHz |
| --- | --- | --- | --- | --- | --- |
| 1 | 940 | A,W,S | 330 | 7.8 | 3500 |
| 2 | 860 | A,W,S | 280 | 6.5 | 2500 |
| 3 | 900 | A,W,S | 310 | 7.0 | 4000 |
| 4 | 880 | A,W,S | 310 | 6.9 | 3000 |
| 5 | 920 | A,W,S | 260 | 6.0 | 2100 |
| 6 | 860 | A,W,S,M | 270 | 6.7 | 2300 |
| 7 | 900 | A,W,S,C | 290 | 6.8 | 2300 |
| 8 | 880 | A,W,S,F | 280 | 6.5 | 2700 |
| 9 | 860 | A,W,S,M | 250 | 6.3 | 2100 |
| 10 | 900 | A,W,S,F | 240 | 6.2 | 2200 |
| 11 | 880 | A,W,S | 300 | 7.6 | 3800 |
| 12 | 880 | A,W,S | 290 | 7.7 | 3300 |
| 13 | 920 | A,W,S | 290 | 7.9 | 2100 |
| 14 | 880 | A,W,S | 300 | 6.8 | 3000 |
| 15 | 900 | A,W,S | 290 | 7.4 | 3000 |
| 16 | 850 | A,W,S | 300 | 7.5 | 3300 |
| 17 | 900 | A,W,S | 310 | 7.1 | 3500 |
| 18 | 880 | A,W,S | 310 | 7.0 | 3300 |
| 19 | 880 | A,W,S | 310 | 7.0 | 3300 |
| 20 | 880 | A,W,S | 315 | 7.2 | 3500 |
| *21 | 1000 (fired) | | | unsintered | |
| *22 | 800 | A,W,S | 190 | 7.6 | 2000 |
| *23 | 950 | A,W,S | 200 | 5.6 | 1800 |
| *24 | 850 | A,W,C | 290 | 8.3 | 2600 |

*indicates out of the scope of the invention.
**A: Alumina
W: Wollastonite
S: Quartz
M: Mullite
C: Cordierite
F: Forsterite As seen in Tables 1 and 2, in Samples Nos. 1 through 20, which are embodiments of the present invention, the flexural strengths are high, namely, 240–330 MPa, the dielectric constants are low, that is, 6.0–7.9, and the Q factors are high, namely, 2100–4000. Thus, the samples exhibit excellent characteristics as a ceramic substrate for the ceramic circuit component. The samples can be sintered at a low temperature of up to 940° C., and the wollastonite crystal phases were confirmed by the X-ray diffraction analysis.

As regards Samples Nos. 14 through 16, which contain $Li_2O$, $K_2O$ or $Na_2O$ in the glass, the melting temperature of the glass was reduced. Thus, the reduction of the sintering temperatures was confirmed, as understood in comparison with Sample No. 13, for example.

As regards Samples No. 17 through 20, which contain $TiO_2$, $ZrO_2$, $CrO_2$ or CuO in the glass, it was confirmed by the X-ray diffraction analysis that the cystallization was promoted in comparison with Sample No. 4, though it is not shown in Table 2.

Further, the obtained ceramic multilayer substrate was so cut as to expose a section thereof perpendicular to the conductor layer. It was confirmed that diffusion of Ag in the ceramic was inhibited in comparison with the conventional cases.

On the other hand, Sample No. 21, which is out of the scope of the present invention, was not sintered at a temperature of up to 1000° C. since the amount of the glass was low. As regards Sample No. 22, the flexural strength was reduced, namely, it was 190 MPa, since the amount of the glass was too high. Sample No. 23, since the amount of quartz was too high, exhibited a low flexural strength, namely, 200 MPa, and a low Q factor, that is, 1800. For Sample No. 24, to which no quartz was added, a dielectric constant of up to 8 could not be achieved.

As seen in the above description, by firing the ceramic substrate composition of the present invention at, a low temperature, that is, at a temperature of up to about 1000° C., a ceramic substrate having the characteristics of high strength, low dielectric constant, and high Q factor (low loss) can be obtained. Further, since sintering at a temperature of up to about 1000° C. is possible, a conductor with low electric resistance, such as a conductor of an Ag type, a Cu type, or the like, can be fired together with the ceramic. In addition, when the composition is fired together with Ag type electrodes, the diffusion of Ag into the ceramic substrate can be inhibited.

Accordingly, by use of the ceramic substrate, a ceramic circuit component with excellent high frequency characteristics and a high speed performance can be obtained.

What is claimed is:

1. A ceramic substrate composition comprising about 26 to 48% by weight of a $CaO-Al_2O_3-B_2O_3-SiO_2$ glass, about 35 to 68% by weight of at least one ceramic selected from the group consisting of alumina, mullite, cordierite and forsterite, and about 3 to 24% by weight of quartz wherein said glass contains 5.5 to 12.3% by weight of $B_2O_3$ and sufficient CaO and $SiO_2$ to produce crystalline wollastonite on firing said composition at a temperature of about 800 to 1000° C.

2. A ceramic substrate composition according to claim 1, further comprising up to about 5% by weight of at least one alkali metal oxide selected from the group consisting of $Li_2O$, $K_2O$ and $Na_2O$.

3. A ceramic substrate composition according to claim 2, further comprising a positive amount up to about 5% by weight of at least one metal oxide selected from the group consisting of $TiO_2$, $ZrO_2$, $CrO_2$ and CuO.

4. A ceramic substrate composition according to claim 1, further comprising a positive amount up to about 5% by weight of at least one metal oxide selected from the group consisting of $TiO_2$, $ZrO_2$, $CrO_2$ and CuO.

5. A ceramic substrate composition according to claim 1, wherein said ceramic comprises alumina.

6. A ceramic substrate composition according to claim 5, comprising about 30 to 46% by weight of glass, about 40 to 60% by weight of said ceramic and about 4 to 20% by weight of quartz.

7. A ceramic substrate composition according to claim 6 containing up to 15% by weight of quartz.

8. A ceramic substrate composition according to claim 1 containing up to 15% by weight of quartz.

9. A ceramic substrate composition according to claim 1 in which the glass contains 40 to 46.7 weight percent of CaO and 45 to 46.1 weight percent of $SiO_2$.

* * * * *